(12) United States Patent
Zhang et al.

(10) Patent No.: US 9,929,284 B1
(45) Date of Patent: Mar. 27, 2018

(54) POWER SCHOTTKY DIODES HAVING LOCAL CURRENT SPREADING LAYERS AND METHODS OF FORMING SUCH DEVICES

(71) Applicant: Cree, Inc., Durham, NC (US)

(72) Inventors: Qingchun Zhang, Cary, NC (US); Alexander Suvorov, Durham, NC (US)

(73) Assignee: Cree, Inc., Durham, NC (US)

( * ) Notice: Subject to any disclaimer, the term of this patent is extended or adjusted under 35 U.S.C. 154(b) by 24 days.

(21) Appl. No.: 15/349,092

(22) Filed: Nov. 11, 2016

(51) Int. Cl.
| | |
|---|---|
| H01L 29/49 | (2006.01) |
| H01L 29/872 | (2006.01) |
| H01L 29/08 | (2006.01) |
| H01L 29/06 | (2006.01) |
| H01L 29/16 | (2006.01) |
| H01L 29/15 | (2006.01) |
| H01L 21/04 | (2006.01) |

(52) U.S. Cl.
CPC .......... *H01L 29/872* (2013.01); *H01L 21/047* (2013.01); *H01L 21/0465* (2013.01); *H01L 29/0623* (2013.01); *H01L 29/0626* (2013.01); *H01L 29/0696* (2013.01); *H01L 29/08* (2013.01); *H01L 29/158* (2013.01); *H01L 29/1608* (2013.01)

(58) Field of Classification Search
CPC . H01L 29/872; H01L 21/0465; H01L 21/047; H01L 29/0623
See application file for complete search history.

(56) References Cited

U.S. PATENT DOCUMENTS

| | | |
|---|---|---|
| 8,563,986 B2 | 10/2013 | Zhang |
| 2008/0303114 A1 | 12/2008 | Shibata |
| 2011/0248335 A1 | 10/2011 | Higashida |
| 2012/0098064 A1 | 4/2012 | Onishi |
| 2013/0037852 A1 | 2/2013 | Tamaki |
| 2014/0191309 A1 | 7/2014 | Eguchi |
| 2015/0028350 A1 | 1/2015 | Suvorov et al. |

(Continued)

OTHER PUBLICATIONS

Kosugi et al., "First Experimental Demonstratinon of SiC Super-Junction (SJ) Structure by Multi-Epitaxial Growth Method," IEEE Proceedings of the 26th International Symposium of Power Semiconductor Devices & IC's, Jun. 15-29, 2014, Waikoloa, Hawaii, pp. 346-349.

(Continued)

*Primary Examiner* — Michael Shingleton
(74) *Attorney, Agent, or Firm* — Myers Bigel, P.A.

(57) ABSTRACT

A Schottky diode includes a drift region doped with dopants having a first conductivity type, first and second blocking junctions that are doped with dopants having a second conductivity type in an upper portion of the drift region, first and second local current spreading layers doped with dopants having the first conductivity type underneath the respective first and second blocking junctions, and first and second contacts on respective lower and upper portions of the drift region. A channel is provided in the upper portion of the drift region between the first and second blocking junctions, the channel doped with dopants having the first conductivity type and a concentration of dopants in at least a first portion of the channel being lower than the concentration of dopants in the first and second local current spreading layers.

19 Claims, 7 Drawing Sheets

(56) References Cited

U.S. PATENT DOCUMENTS

| | | | |
|---|---|---|---|
| 2015/0028351 A1* | 1/2015 | Van Brunt | H01L 29/1608 |
| | | | 257/77 |
| 2017/0025530 A1* | 1/2017 | Cooper, Jr. | H01L 29/7816 |
| 2017/0133503 A1* | 5/2017 | Matocha | H01L 29/7806 |

OTHER PUBLICATIONS

Kosugi et al., "Development of SiC Super-Junction (SJ) Device by Deep Trench-Filling Epitaxial Growth," Trans Tech Publications, Switzerland, Materials Science Forum vols. 740-742 (2013) pp. 785-788.

Fujihira, Tatsuhiko, "Theory of Semiconductor Superjunction Devices," *Japanase Journal of Applied Physics* 36.Part 1, No. 10 (1997): 6254-262.

Li, Zhongda; Naik, Harsh and Chow, T. Paul. "Deisgn of GaN and SiC 5-20kV Vertical Superjunction Structures," Center for Integrated Electroncis, Rensselaer Polytechnic Institute, 2012 IEEE.

Janson, Martin, "Hydrogen Diffusion and Ion Implantation in Silicon Carbide, "KTH, Royal Institute of Technology, Materials and Semiconductor Physics, Stockholm 2003.

* cited by examiner

POWER SCHOTTKY DIODES HAVING LOCAL CURRENT SPREADING LAYERS AND METHODS OF FORMING SUCH DEVICES

FIELD OF THE INVENTION

The present invention relates to power semiconductor devices and, more particularly, to power Schottky diodes.

BACKGROUND

Power semiconductor devices are used to carry large currents and support high voltages. High power semiconductor devices are typically fabricated from silicon carbide or gallium nitride based semiconductor materials. One widely used power semiconductor device is the Schottky diode.

Power semiconductor devices can have a lateral structure or a vertical structure. In a device having a lateral structure, the terminals of the device are on the same major surface (i.e., top or bottom) of a semiconductor layer structure. In contrast, in a device having a vertical structure, at least one terminal is provided on each major surface of the semiconductor layer structure (e.g., in a Schottky diode, the anode contact may be on the top surface of the device and the cathode contact may be on the bottom surface of the device). The semiconductor layer structure may or may not include an underlying substrate. Herein, the term "semiconductor layer structure" refers to a structure that includes one or more semiconductor layers such as semiconductor substrates and/or semiconductor epitaxial layers.

A conventional silicon carbide power Schottky diode typically has a silicon carbide substrate having a first conductivity type (e.g., an n-type substrate), on which an epitaxial layer structure having the first conductivity type (e.g., n-type) is formed. This epitaxial layer structure (which may comprise one or more separate layers) functions as a drift region of the device. The Schottky diode includes an "active region" that may be formed on and/or in the drift region. The active region acts as a main junction for blocking voltage in the reverse bias direction and providing current flow in the forward bias direction. Typically, a plurality of Schottky diodes are formed on a wafer. Each Schottky diode typically has a "unit cell" structure in which the active region of the device includes a plurality of individual diodes that are disposed in parallel to each other and that together function as a single power Schottky diode. Each power Schottky diode will typically have its own edge termination. After the wafer is fully formed and processed, the wafer may be diced to separate the individual edge-terminated power Schottky diodes. The portion of the wafer included in each individually singulated device is called the substrate.

A power Schottky diode is designed to block (in the reverse blocking state) or pass (in the forward operating state) large voltages and/or currents. For example, in the blocking state, a power Schottky diode may be designed to sustain hundreds or thousands of volts of electric potential. However, as the applied voltage approaches or passes the voltage level that the device is designed to block, non-trivial levels of current may begin to flow through the diode. Such current, which is typically referred to as "leakage current," may be highly undesirable. Leakage current may begin to flow if the voltage is increased beyond the design voltage blocking capability of the device, which may be a function of, among other things, the doping and thickness of the drift region. Current leakage can also occur for other reasons, such as electric field crowding at the edges of the active region and/or failure of an edge termination and/or the primary junction of the device. If the voltage on the device is increased past the breakdown voltage to a critical level, the increasing electric field may result in an uncontrollable and undesirable runaway generation of charge carriers within the semiconductor device, leading to a condition known as avalanche breakdown.

For a vertical Schottky diode, the blocking voltage rating is typically determined by the thickness and the doping concentration of the drift region. The breakdown voltage of the device may be increased by reducing the doping concentration of the drift region and/or by increasing the thickness of the drift region. Typically, during the design phase, a desired blocking voltage rating is selected, and then the thickness and doping of the drift region are chosen based on the desired blocking voltage rating. Since the drift region is the current path for the device in the forward "on" state, the decreased doping concentration and/or increased thickness of the drift region may result in a higher on-state resistance for the device. Thus, there is an inherent tradeoff between the on-state resistance and blocking voltage.

Figure 1:
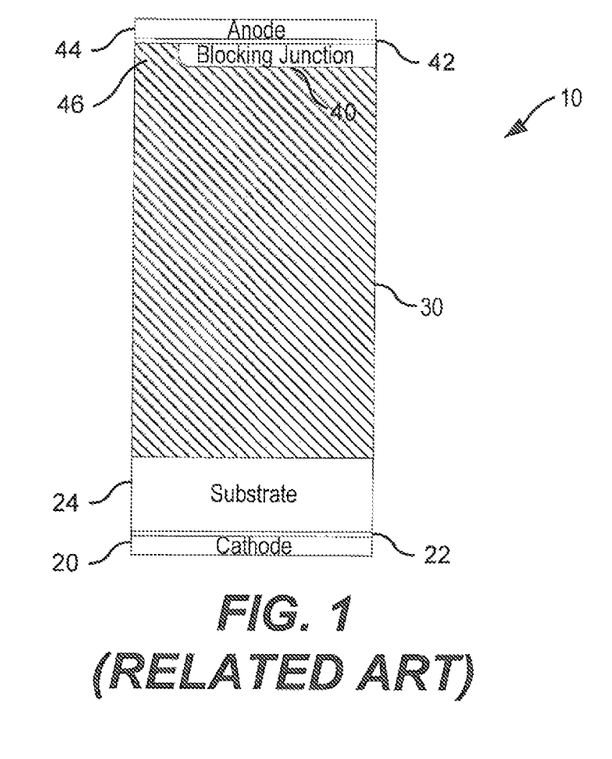
FIG. 1 is a schematic cross-sectional diagram of a conventional power Schottky diode.

FIG. 1 is a schematic cross-sectional diagram of a conventional power Junction Barrier Schottky ("JBS") diode 10. As shown in FIG. 1, the JBS diode 10 includes a cathode contact 20, an ohmic contact layer 22, an n-type substrate 24, an n-type drift region 30, a p-type blocking junction 40, a channel 46, a Schottky contact 42 and an anode contact 44. The cathode contact 20 and the anode contact 44 may each comprise a highly conductive metal layer. The Schottky contact 42 may comprise a layer that forms a Schottky junction with the drift region 30 and may comprise, for example, an aluminum layer. The n-type substrate 24 may comprise a silicon carbide substrate that is heavily doped with n-type impurities such as nitrogen or phosphorous. The ohmic contact layer 22 may comprise a metal that forms an ohmic contact to n-type silicon carbide so as to form an ohmic contact to the silicon carbide substrate 24. The drift region 30 may comprise an epitaxially grown n-type silicon carbide semiconductor region. The p-type blocking junction 40 may be a p-type implanted region in an upper portion of the drift region 30 that is heavily implanted with p-type dopants. The channel 46 is positioned adjacent the p-type blocking junction 40. Current flows through the channel 46 when the diode 10 is in its forward on-state.

SUMMARY

Pursuant to embodiments of the present invention, power Schottky diodes are provided that include a drift region having an upper portion and a lower portion, at least some of the drift region doped with dopants having a first conductivity type. First and second blocking junctions are provided in the upper portion of the drift region that are doped with dopants having a second conductivity type, the second conductivity type being opposite the first conductivity type. First and second local current spreading layers are provided underneath the respective first and second blocking junctions, the first and second local current spreading layers doped with dopants having the first conductivity type. A first contact is provided on the upper portion of the drift region and a second contact is provided on the lower portion of the drift region and vertically spaced apart from the first contact. A substrate may be interposed between the drift region and the second contact in some embodiments. A channel is provided in the upper portion of the drift region between the first and second blocking junctions, the channel doped with dopants having the first conductivity type and a concentration of dopants in at least a first portion of the channel being lower than the concentration of dopants in the first and second local current spreading layers.

In some embodiments, the first local current spreading layer may include a lateral section that extends underneath the first blocking junction and a vertical section that extends upwardly from the lateral section along a sidewall of the first blocking junction, the vertical section comprising part of the channel.

In some embodiments, a width of the vertical section of the first local current spreading layer may be between 0.1 and 0.75 microns.

In some embodiments, a distance between the first and second blocking junctions may be at least 1.5 microns.

In some embodiments, a doping concentration of at least a portion of the local current spreading layer may exceed a doping concentration of the first portion of the channel by at least a factor of five.

In some embodiments, a lateral width of the first blocking junction may be approximately equal to a lateral width of the first current spreading layer.

In some embodiments, the drift region may include a superjunction structure having alternating vertically extending regions of silicon carbide having the respective first and second conductivity types.

In some embodiments, the drift region, the first and second blocking junctions and the first and second local current spreading layers may be silicon carbide.

In some embodiments, first and second doping concentrations of the respective first and second local current spreading layers exceed a third doping concentration of the lower portion of the drift region and a fourth doping concentration of an upper portion of the drift region that is below the first and second local current spreading layers.

Pursuant to further embodiments of the present invention, power Schottky diodes are provided that include a drift region having an upper portion and a lower portion, at least some of the drift region doped with dopants having a first conductivity type; a first blocking junction and a second blocking junction in the upper portion of the drift region, the first and second blocking junctions doped with dopants having a second conductivity type, the second conductivity type being opposite the first conductivity type; a first contact on the upper portion of the drift region; a second contact on the lower portion of the drift region and separated from the first contact along a vertical axis, and a channel doped with dopants having the first conductivity type in the upper portion of the drift region between the first and second blocking junctions, the channel having a non-uniform doping concentration along a lateral cross-section thereof. A substrate may be interposed between the drift region and the second contact in some embodiments.

In some embodiments, the Schottky diode may further include a first local current spreading layer underneath the first blocking junction and a second local current spreading layer underneath the second blocking junction, the first and second local current spreading layers doped with dopants having the first conductivity type, the concentration of dopants in the first and second local current spreading layers being higher than the concentration of dopants in the drift region.

In some embodiments, a vertical section of the first local current spreading layer may comprise a first side portion of the channel and a vertical section of second local current spreading layer may comprise a second side portion of the channel that is opposite the first side of the channel, the vertical sections of the first and second local current spreading layers having a higher doping concentration than a middle section of the channel so that the channel has the non-uniform doping concentration along the lateral cross-section thereof.

In some embodiments, a width of the vertical section of the first local current spreading layer may be between 0.1 and 0.75 microns.

In some embodiments, a distance between the first and second blocking junctions may be at least 1.5 microns.

In some embodiments, a doping concentration of at least a portion of the local current spreading layer may exceed a doping concentration of a middle section of the channel by at least a factor of five.

In some embodiments, a lateral width of the first blocking junction may be less than a lateral width of the first current spreading layer.

In some embodiments, the drift region may include a superjunction structure having alternating vertically extending regions of silicon carbide having the respective first and second conductivity types.

In some embodiments, the drift region, the first and second blocking junctions and the first and second local current spreading layers may be silicon carbide.

Pursuant to still further embodiments of the present invention, methods of fabricating a power Schottky diode are provided in which a drift region that is doped with dopants having a first conductivity type is formed on a substrate. First and second blocking junctions that are doped with dopants having a second conductivity type are formed in the upper portion of the drift region, the second conductivity type being opposite the first conductivity type. First and second local current spreading layers are formed in the upper portion of the drift region, the first and second local current spreading layers doped with dopants having the first conductivity type. A first contact is formed on the upper portion of the drift region and a second contact is formed on the lower portion of the drift region, the second contact being vertically spaced apart from the first contact. A substrate may be interposed between the drift region and the second contact in some embodiments. A channel is provided in the upper portion of the drift region between the first and second blocking junctions, the channel doped with dopants having the first conductivity type and a concentration of dopants in at least a first portion of the channel being lower than the concentration of dopants in the first and second local current spreading layers. At least a portion of the first local current spreading layer is underneath the first blocking junction and at least a portion of the second local current spreading layer underneath the second blocking junction.

In some embodiments, the first and second blocking junctions may be formed by forming an ion implantation mask pattern on an upper surface of the drift region and then implanting dopants having the second conductivity type into the upper portion of the drift region through openings in the ion implantation mask pattern to form the first and second blocking junctions.

In some embodiments, the first and second local current spreading layers may be formed underneath the respective first and second blocking junctions by partially etching the ion implantation mask pattern to provide an etched ion implantation mask pattern and then implanting dopants having the first conductivity type into the upper portion of the drift region through openings in the ion implantation mask pattern to form the first and second local current spreading layers.

In some embodiments, the dopants having the first conductivity type that are implanted to form the first and second local current spreading layers are implanted to a depth deeper into the drift region than the dopants having the second conductivity type that are implanted to form the first and second blocking junctions.

In some embodiments, the dopants implanted to form the first and second local current spreading layers may be implanted using a channeled ion implantation process.

In some embodiments, the drift region comprises 4H silicon carbide, and implanting dopants having the first conductivity type into the upper portion of the drift region through openings in the etched ion implantation mask pattern to form the first and second local current spreading layers may comprise implanting the first conductivity type dopants at an angle that is within +/−1.5° of one of the <11-23>, <−1-123>, <1-213>, <−12-13>, <2-1-13> or <−2113> crystallographic axes of the drift region.

In some embodiments, the first local current spreading layer may surround a bottom and sidewalls of the first blocking junction.

In some embodiments, the first local current spreading layer may include a portion that is within the channel.

In some embodiments, a lateral width of the portion of the first local current spreading layer that is within the channel may be between 0.1 and 0.75 microns.

In some embodiments, a distance between the first and second blocking junctions may be at least 1.5 microns.

In some embodiments, a doping concentration of at least a portion of the local current spreading layer may exceed a doping concentration of the first portion of the channel by at least a factor of five.

In some embodiments, a lateral width of the first blocking junction may be approximately equal to a lateral width of the first local current spreading layer.

DETAILED DESCRIPTION

Figure 2A:
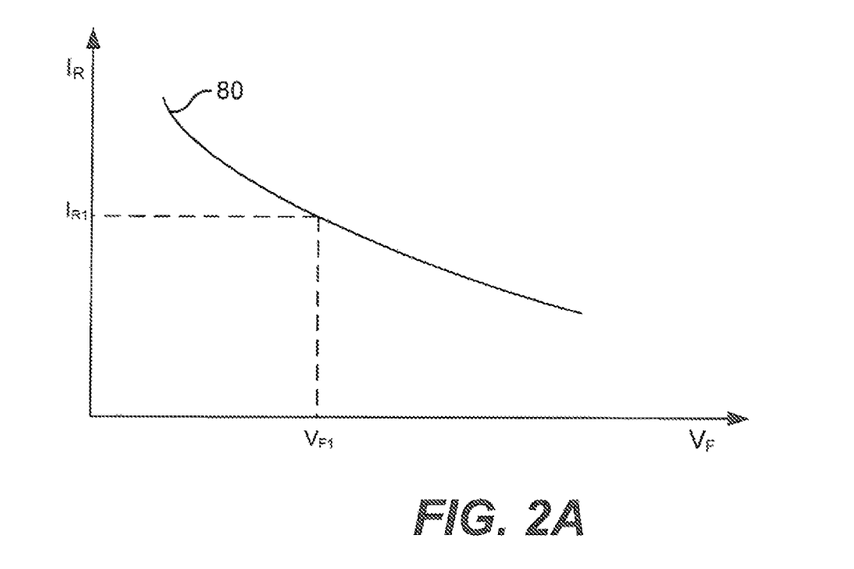
FIG. 2A is a graph illustrating the tradeoff between the forward voltage performance and reverse leakage current performance in a conventional power Schottky diode.

An inherent tradeoff generally exists between the forward voltage ($V_F$) of a power Schottky diode and the reverse leakage current ($I_R$) of the device. This tradeoff is illustrated in FIG. 2A, which is graph illustrating the $V_F$ versus $I_R$ characteristics faced by a device designer for a conventional power Schottky diode. As illustrated, if the designer has to, for example, maintain the forward voltage below a specified level $V_{F1}$, then the reverse leakage current level is essentially set at the level $I_{R1}$ by the characteristics of the curve.

Demand exists for power Schottky diodes that exhibit both a low forward voltage and a low reverse leakage current. A method to obtain such a device is to move the $V_F$-$I_R$ curve of FIG. 2A downwardly and to the left. This is shown schematically in FIG. 2B. As illustrated, if the curve is moved in such a fashion, the forward voltage $V_{F1}$ may be achieved while the reverse leakage current can be reduced below the value $I_{R1}$ to a lower value $I_{R2}$.

Figure 2B:
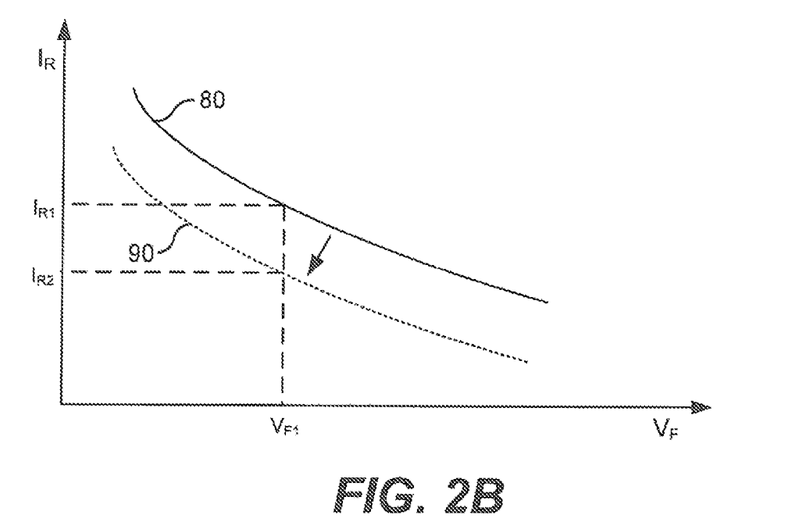
FIG. 2B is a graph illustrating how it may be desirable to shift the $V_F$-$I_R$ curve in order to obtain improved diode performance.

One technique that can be used to move the $V_F$-$I_R$ curve of FIG. 2A downwardly and to the left as shown in FIG. 2B is to use a drift region that has a so-called superjunction structure. A superjunction-type drift region has alternating, side-by-side heavily-doped n-type and p-type regions that are often referred to as "pillars." The pillars may have various shapes, such a column shapes, bar shapes, etc. The thickness and doping of these pillars may be controlled so that the superjunction will act like a p-n junction with low resistance and a high breakdown voltage. Thus, the superjunction structures may reduce or avoid the conventional tradeoff between the breakdown voltage of the device and the doping level and thickness of the drift region, allowing for a more highly doped drift region without a corresponding reduction in the reverse breakdown voltage of the device. However, superjunction drift regions may increase the fabrication cost of the device.

Another technique for reducing the reverse leakage current of a power Schottky diode while maintaining a desired forward voltage level is to increase the doping in the channels (see channel 46 in FIG. 1). This may be accomplished, for example, by more highly doping the upper portion of the drift region to form a current spreading layer therein prior to formation of the blocking junctions. The channels are thus formed in the more highly-doped current spreading layer. The provision of this more highly-doped current spreading layer (and hence higher channel doping) may reduce the reverse leakage current of the device without a significant increase in the forward voltage. However, generally speaking, the ideal width of the channels is a function of the doping concentration of the channels, with increased doping levels corresponding to reduced channel widths. This may result in problems when the doping of the channels is increased beyond a certain level.

In particular, a state-of-the-art conventional silicon carbide based power Schottky diode that does not include a current spreading layer (in such a device the entire drift region may be doped to a concentration of, for example, $2 \times 10^{16}/\text{cm}^3$), may have a channel width on the order of 3 microns for each channel in the device. If a current spreading layer having an increased dopant concentration of, for example, $5 \times 10^{16}/\text{cm}^3$ is formed in the upper portion of the drift region, the ideal width of the channel may decrease to, for example, 1.5-2.0 microns. In order to increase the doping of the channel to, for example, a concentration of $1 \times 10^{17}/\text{cm}^3$, the lateral width of the channel needs to be reduced to perhaps 0.5 microns or less.

As the width of the channel is reduced, it may become difficult to form blocking regions and channels therebetween with sufficient accuracy to ensure proper device operation. For example, the drift region is typically formed via epitaxial growth. However, in silicon carbide it may be difficult to obtain a constant doping level during the epitaxial growth process, and hence variations in doping of, for example, +/−15% are common. Moreover, the oppositely doped blocking junctions are typically formed by ion implantation, and ion implantation masks are used to shield the channels during the formation of the blocking junctions by implantation. The ion implantation masks are typically formed using a photolithography process. Because the semiconductor substrate may be bowed, portions of the photoresist mask that are over the channels may be exposed to light, and hence variations in the width of the opening may be 0.1 microns or more. Given the combination of the variation in the width of the channel and the variation in the doping concentration it may be difficult to consistently fabricate power Schottky diodes that have nominal 0.5 micron channel widths.

Pursuant to embodiments of the present invention, power Schottky diodes are provided that have local current spreading layers. The local current spreading layers may comprise a series of discontinuous, more highly-doped regions that are formed in the upper portion of the drift region. In some embodiments, the local current spreading layers may be formed underneath the blocking junctions. In some embodiments, the local current spreading layers may also be formed in the channels along one or more sidewalls of the blocking junctions. In such embodiments, the channels may have a non-uniform doping concentration along a lateral cross-section thereof. The local current spreading layers may reduce the intensity of the electric field in the channels during reverse blocking operation, which may facilitate reducing the reverse leakage current of the device. Moreover, since at least a portion of each channel may be more lightly doped (e.g., doped to the same concentration as the remainder of the drift region), the ideal width of the channels may not be narrowed (or at least not significantly narrowed). Thus, the power Schottky diodes according to embodiments of the present invention may be consistently fabricated in a commercial production setting due to their increased channel widths while maintaining a desired forward voltage level and exhibiting reduced reverse leakage current.

Example embodiments of the present invention will now be described with reference to FIGS. 3A-7C. It will be appreciated that features of the different embodiments disclosed herein may be combined in any way to provide many additional embodiments.

Figure 3A:
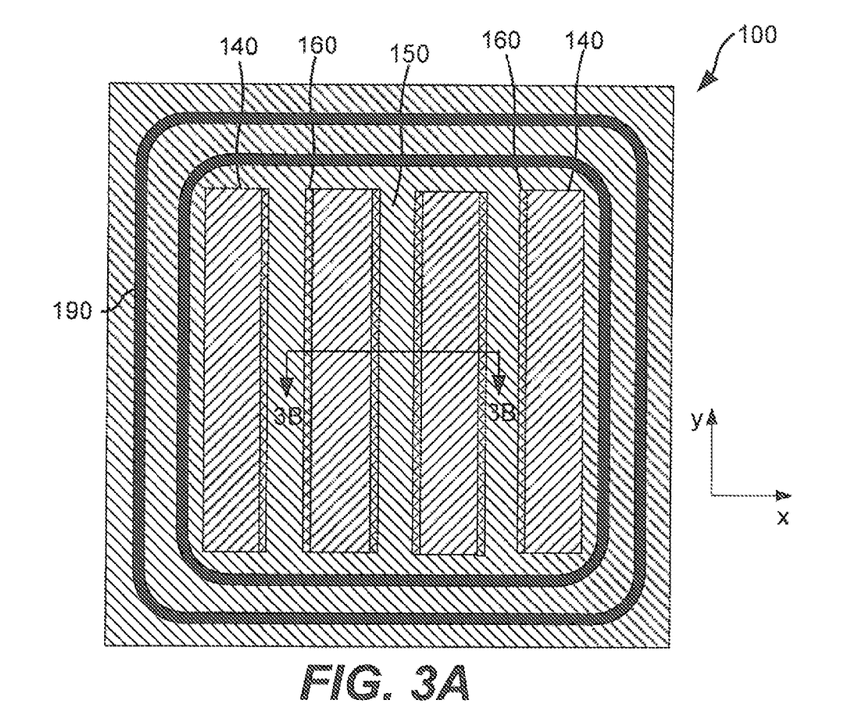
FIG. 3A is a schematic plan view of a power Schottky diode according to certain embodiments of the present invention.
Figure 3B:
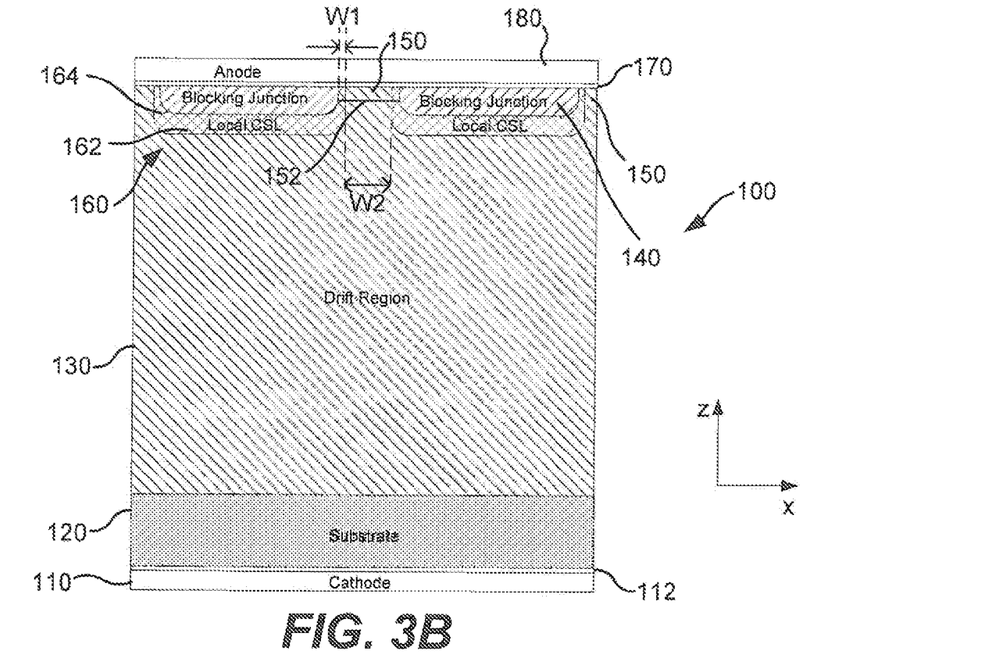
FIG. 3B is a schematic cross-sectional view taken along line 3B-3B of FIG. 3A.

FIG. 3A is a simplified schematic plan view of a power Schottky diode 100 according to embodiments of the present invention. In FIG. 3A, the topside metallization of the power Schottky diode 100 has been omitted to illustrate the locations of the channels and the blocking junctions. FIG. 3B is a schematic cross-sectional view of the power Schottky diode 100 taken along line 3B-3B of FIG. 3A. It will be appreciated that FIG. 3B only illustrates portions of several unit cells of the device.

As shown in FIGS. 3A-3B, the power Schottky diode 100 includes a cathode contact 110, an ohmic contact layer 112 on the cathode contact 110, and a semiconductor substrate 120 on the ohmic contact layer 112 opposite the cathode contact 110. The illustrated device is a silicon carbide based n-type Schottky diode, so the semiconductor substrate 120 may be an n-type silicon carbide semiconductor substrate 120 that is doped with n-type dopants. An n-type silicon carbide drift region 130 may be formed via epitaxial growth on the n-type silicon carbide substrate 120. A series of p-type blocking junctions 140 are formed in the upper portion of the drift region 130. Channels 150 may be defined in the portions of the n-type drift region 130 that are between the p-type blocking junctions 140. A Schottky contact 170 may be formed on top of the blocking junction 140 and the channels 150. An anode contact 180 may be formed on the Schottky contact 170 opposite the drift region 130.

The n-type silicon carbide semiconductor substrate 120 may comprise, for example, a 4H silicon carbide semiconductor wafer. The substrate 120 may be doped with n-type impurities (i.e., an n$^+$ silicon carbide substrate). The impurities may comprise, for example, nitrogen and/or phosphorous. The doping concentration of the substrate 120 may be, for example, between $1\times10^{18}$ atoms/cm$^3$ and $1\times10^{21}$ atoms/cm$^3$. The substrate 120 may be any appropriate thickness (e.g., between 100 and 500 microns thick). The thickness of the substrate shown in FIG. 3B is not to scale to better illustrate the structure of the other layers in the power Schottky diode 100.

The n-type silicon carbide drift region 130 may be doped during growth with n-type dopants to a concentration of, for example, $2\times10^{16}$/cm$^3$. In example embodiments, the drift region 130 may be between 3 and 100 microns thick.

The p-type blocking junctions 140 may be highly doped with p-type dopants (e.g., to a concentration of $5\times10^{18}$/cm$^3$), and may be formed via ion implantation in some embodiments in an upper portion of the drift region 130. The blocking junctions 140 may reduce the electric field to help shield the Schottky contact 170 from the electric field when the power Schottky diode 100 operates in the reverse blocking state. The p-type blocking junction 140 may be formed by ionizing p-type dopants and accelerating the ions in an ion implantation target chamber at a predetermined kinetic energy as an ion beam into the upper surface of the drift region 130. Based on the predetermined kinetic energy, the ionized p-type dopants may penetrate into the drift region 130 to a certain depth. The channels 150 pass current in the on-state and block voltage in the blocking state. Current flows through the channels 150 when the diode 100 is in its forward on-state.

The cathode contact 110 may comprise a highly conductive metal layer such as a silver layer. In some embodiments, the cathode contact 110 may comprise a multilayer metal structure such as, for example, a Ti/Ni/Ag structure. The ohmic contact layer 112 may comprise a material that forms an ohmic contact to the substrate 120. In some embodiments, the substrate 120 may be partially or completely removed prior to formation of the ohmic contact layer 112 and the cathode contact 110.

The Schottky contact 170 may comprise a conductive layer that forms a Schottky junction with the silicon carbide drift region 130 and may comprise, for example, a titanium layer or a nickel layer. The anode contact 180 may comprise a highly conductive metal contact such as an aluminum layer.

As is further shown in FIG. 3B, an n-type local current spreading layer 160 may be formed to at least partially surround each p-type blocking junction 140. Each local current spreading layer 160 may include a lateral section 162 that extends laterally underneath a respective one of the p-type blocking junctions 140, and one or more vertical sections 164 that each extend along a sidewall of a p-type blocking junction 140. The vertical sections 164 comprise part of the channel 150. The local current spreading layers 160 may be doped with n-type dopants at a doping concentration that is higher than the doping concentration of the n-type drift region 130. In example embodiments the n-type local current spreading layers 160 may have doping concentrations that are at least four times the doping concentration of the n-type drift region 130. In some embodiments, the doping concentration of the of the n-type local current spreading layers 160 may be 3-10 times the doping concentration of the n-type drift region 130. In some embodiments, an upper portion of the drift region 130 that is below the local current spreading layers 160 may have a doping concentration that is greater than a doping concentration of the lower portion of the drift region 130. In such embodiments, the local current spreading layers 160 may have doping concentrations that exceed the doping concentration of the upper portion of the drift region 130 that is below the first and second local current spreading layers 160. For example, the n-type local current spreading layers 160 may be doped to a concentration of $1 \times 10^{17}/cm^3$ in an example embodiment.

Since the local current spreading layers 160 include vertical sections that extend into the channels 150, the channels 150 may have a non-uniform doping concentration along a lateral cross-section thereof. For example, referring again to FIG. 3B, along the horizontal line 152 that extends laterally across the channel 150, the doping concentration of the channel 150 varies, with the doping concentration (of n-type dopants in this example) being higher at the edge regions where the line is within the local current spreading layers 160 and lower in the middle portion of the channel 150.

As is shown in FIG. 3A, a plurality of guard rings 190 surround the active region of the power Schottky diode 100. The guard rings 190 may comprise p-type trench regions that are formed via ion implantation into an upper surface of the drift region 130. The guard rings 190 are formed outside of the active region of the power Schottky diode 100. The guard rings 190 may extend into the drift region 130 to a depth that is about the same as the depth of the blocking junctions 140. The guard rings 190 may comprise edge termination structures. As known to those of skill in the art, when power semiconductor devices are operated in the blocking state, leakage currents may begin to flow at the edges of the active region as the voltage is increased. Leakage currents tend to flow in these edge regions because electric field crowding effects at the edge of the device may result in increased electric fields in these regions. If the voltage applied to the device is increased past the breakdown voltage to a critical level, the increasing electric field may result in runaway generation of charge carriers within the semiconductor device, leading to avalanche breakdown. When avalanche breakdown occurs, the current increases sharply and may become uncontrollable, and an avalanche breakdown event may damage or destroy the semiconductor device.

In order to reduce this electric field crowding (and the resulting increased leakage currents), edge termination structures such as guard rings may be provided that surround part or all of the active region of a power semiconductor device. These edge termination structures may be designed to spread the electric field out over a greater area, thereby reducing the electric field crowding. Guard rings are one known type of edge termination structure. While FIG. 3A illustrates a power semiconductor device 100 that uses two guard rings 190 as an edge termination structure, it will be appreciated that more or fewer guard rings 190 may be provided, and that any appropriate edge termination structure may be used. For example, in other embodiments, the guard rings 190 may be replaced with a junction termination extension. It will also be appreciated that the edge termination structure may be omitted in some embodiments.

When the power Schottky diode 100 is operated in reverse blocking mode, a strong electric field is formed that extends upwardly from the substrate 120 throughout the drift region 130 and toward and into the channels 150. The electric field is reduced in the vicinity of the more highly doped n-type local current spreading layers 160. As the local current spreading layers 160 are provided below and adjacent the channels 150, the intensity of the electric field may be reduced throughout the channels 150. This reduction in the electric field intensity may result in lower reverse leakage currents.

As discussed above, the local current spreading layers 160 include a lateral section 162 that extends laterally underneath a respective one of the p-type blocking junctions 140, and one or more vertical sections 164 that each extend along a sidewall of a p-type blocking junction 140. The vertical sections 164 are within the channels 150. In example embodiments, the vertical sections 164 may have a width W1 in the direction of the widths of the channels 150 of less than 0.6 microns, as is shown in FIG. 3B. In other embodiments, the width W1 may be less than 0.4 microns. In still other embodiments, the width W1 may be less than 0.3 microns. In each of these embodiments, the width W1 may be at least 0.05 microns in some example, cases, or may be at least 0.1 microns in other example cases. It will be appreciated, however, that the vertical sections 164 may have smaller or larger widths.

Since the middle portion of each channel 150 is not part of any local current spreading layer 160, each channel 150 has a lower doped portion that is doped, for example, at the same doping density as the remainder of the drift region 130. As discussed above, the ideal size of the gap W2 between adjacent blocking regions 140 (i.e., the widths of the channels 150) may be a function of the doping density of the channel 150. Since the majority of each channel 150 is doped at the same (lower) level as the drift region 130, the size of the gap W2 may be relatively large. For example, in some embodiments, a distance between the first and second blocking junctions may be at least 1.5 microns. In other embodiments, the distance between the first and second blocking junctions may be at least 2.0 microns. In still other embodiments, the distance between the first and second blocking junctions may be at least 2.5 microns. In each of these embodiments, the distance between the first and second blocking junctions may be less than 5 microns, at least in some cases. Implant masks for the ion implantation steps used to form the blocking junctions 160 may be easily formed with gaps W2 this size, as the size of the gap W2 is much larger than the potential variation in the masking process that may result from misalignment of the mask and/or unintended exposure of a photoresist due to bowing of the substrate.

The power Schottky diode 100 may exhibit improved performance as compared to conventional power Schottky diodes. In particular, the $V_F$ versus $I_R$ performance for the diode 100 may shift the curve in the manner discussed above with reference to FIGS. 2A-2B so that improved reverse leakage current performance may be obtained while maintaining a desired forward voltage level. The power Schottky diodes 100 may consistently be fabricated in a mass production setting as the inclusion of the local current spreading layers 160 makes the size of the gap W2 relatively independent of the doping level of the local current spreading layers 160.

Figure 4:
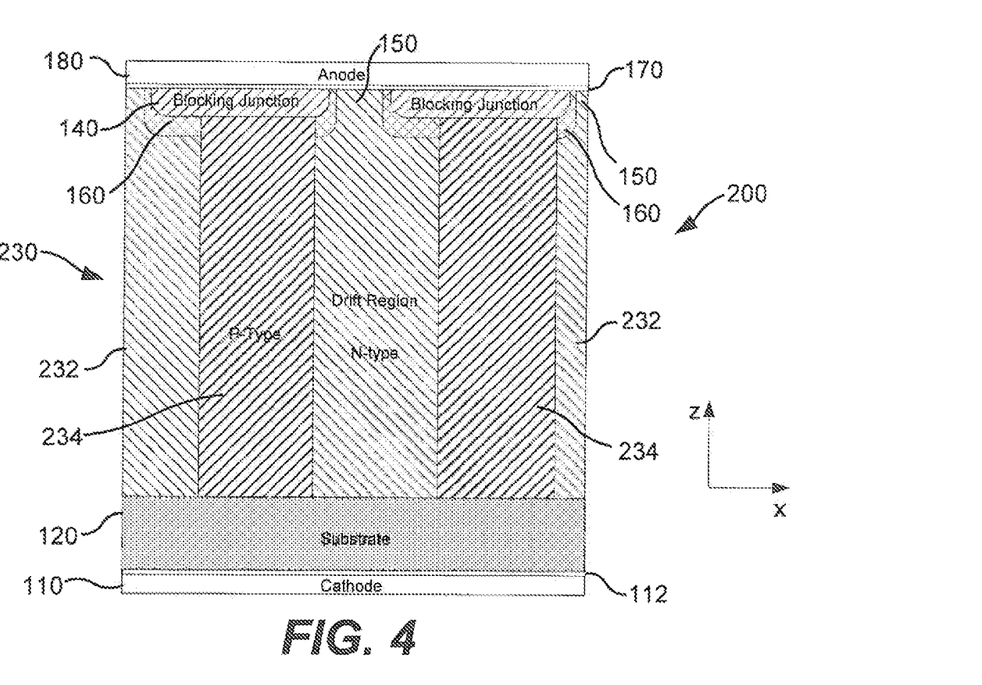
FIG. 4 is a schematic cross-sectional view of a power Schottky diode according to embodiments of the present invention that has both local current spreading layers and a drift region having a superjunction structure.

FIG. 4 is a schematic cross-sectional view of a power Schottky diode 200 according to additional embodiments of the present invention that has both local current spreading layers and a drift region having a superjunction structure. As the power Schottky diode 200 is similar to the power Schottky diode 100 discussed above with reference to FIGS.

3A-3B, like elements in Schottky diode 200 are numbered using the same reference numerals, and will not be discussed further below as they have already been described above. The discussion that follows will focus on the differences between the power Schottky diode 200 and the power Schottky diode 100.

As shown in FIG. 4, the power Schottky diode 200 includes a drift region 230 that has a superjunction structure. In particular, the drift region 230 includes regions 232 that are doped with n-type dopants and regions 234 that are doped with p-type dopants. The regions 232, 234 may extend vertically through the drift region 230 and may have various shapes, is as known to those of skill in the art. The regions 232, 234 often have column shapes or striped shapes and are typically referred to as n-type pillars 232 and p-type pillars 234. U.S. patent application Ser. No. 15/168,310 (the '310 application), filed May 31, 2016, discloses various example superjunction structures that may be used in the power Schottky diodes according to embodiments of the present invention. The entire content of the '310 application is incorporated herein by reference. The power Schottky diode 200 may have any of the superjunction structures disclosed in the '310 application, and the superjunction structure may be formed by any of the techniques disclosed in the '310 application.

In some embodiments, the pillars 232, 234 may be formed using channeled ion implantation techniques that are discussed in the '310 application. These channeled ion implantation techniques may allow the formation of more heavily doped pillars in the drift region 230 than can be achieved in conventional superjunction devices in a single ion implantation step (note that the single ion implantation step may include implantations at multiple different energy levels). The drift region 230 may be grown to an increased thickness. The thicker drift regions increase the voltage blocking capabilities of the device, while the superjunction structure may help reduce or eliminate any offsetting increase in the on-state resistance of the power Schottky diode 200 that would otherwise occur as a result of the increased thickness of the drift layer 230.

While not shown in FIG. 4, it will be appreciated that two or more n-type pillars 232 and/or two or more p-type pillars 234 may be provided in each unit cell. The number of pillars 232, 234 provided will be a function of the width selected for the pillars 232, 234. Typically, each n-type pillar 232 and p-type pillar 234 will have the same width, although embodiments of the present invention are not limited thereto. The superjunction-type drift region 230 may be designed to be charge balanced between the alternating n-type and p-type pillars 232, 234 in some embodiments. Additionally, while FIG. 4 shows the entirety of the drift region 230 being implanted, it will be appreciated that this need not be the case. For example, in other embodiments, only an upper portion of the drift region 230 may be implanted. It will also be appreciated that the doping concentration of the implanted portion of the drift region 230 may tend to decrease with increased distance from the upper surface of the device. Moreover, while in FIG. 4 the superjunction-type drift region 230 has n-type pillars 232 and p-type pillars 234 that appear to extend vertically from the substrate 120, it will be appreciated that in other embodiments the pillars 232, 234 may be at an oblique angle with respect to a top surface of the substrate 120. Such angled pillars may be formed, for example, by forming the pillars 232, 234 using the channeled ion implantation techniques which are discussed herein.

By providing both local current spreading layers 160 and a drift region 230 having a superjunction structure, it is expected that improved shielding of the channels 150 from the electric field that forms in the drift region 230 during reverse blocking operation may be achieved, further shifting the $V_F$ versus $I_R$ performance curve down and to the left as described in FIG. 2B above. It will be appreciated that each of the power Schottky diodes according to embodiments of the present invention that are disclosed herein may have a drift region including a superjunction structure, and that any of the superjunction structures disclosed in the '310 application and/or any other superjunction structure may be used in each of the different embodiments disclosed herein The local current spreading layers 160 may be formed via ion implantation. In some embodiments, the local current spreading layers 160 may be formed using the channeled ion implantation techniques that are disclosed in the '310 application. For example, as discussed in the '310 application, if the power Schottky diodes disclosed herein have a 4H silicon carbide drift layer, the ion implantation may be performed along one or more of the <11-23>, <-1-123>, <1-213>, <-12-13>, <2-1-13> and <-2113> crystallographic axes. Each of these six symmetrically equivalent crystallographic axes are at a 170 tilt from the <0001> crystallographic axis. Along these six crystallographic axes, relatively large channels appear in the crystallographic structure that facilitate deep implantation of dopants via ion implantation. In an alternative embodiment, the ion implantation could be performed along the <11-20> crystallographic axis, which exhibits very large channels along with a low surface density of atoms as viewed along the axis of implantation. Likewise, the power Schottky diodes according to embodiments of the present invention that include superjunction structures in the drift region may form some or all of the superjunction structures via the channeled ion implantation techniques disclosed in the '310 application. The ability to form deep superjunction structures having relatively high doping densities may significantly reduce the on-state resistance of the device, allowing for the use of thicker drift regions that may help increase the breakdown voltage. When channeled implants are used, the implanted regions will be formed at an angle with respect to the top surface of the drift layer.

The use of channeled ion implantation techniques may not only allow for deeper implantation, but may also reduce the lateral distribution of implants, which provides better process control and smaller feature sizes. In addition, significantly thinner implant masks may be used when channeled ion implantation is performed, because the implant energies may be lower than would otherwise be required to achieve similar implant ranges. In some cases, the implant mask may be less than half the thickness that would otherwise be required to obtain similar implant ranges.

FIGS. 5A-5F are schematic cross-sectional diagrams that illustrate a method of fabricating the power Schottky diode 100 according to embodiments of the present invention.

Figure 5A:
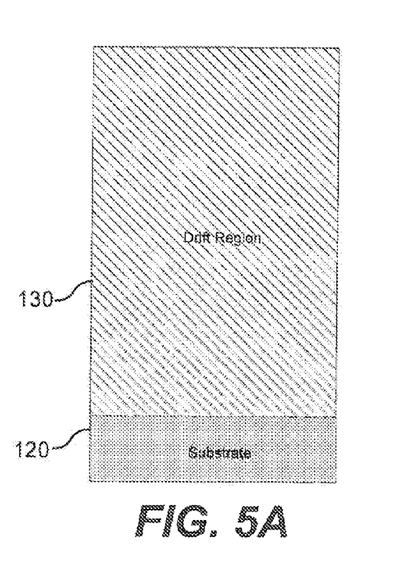
FIGS. 5A-5F are schematic cross-sectional diagrams that illustrate a method of fabricating a power Schottky diode according to embodiments of the present invention.
Figure 5B:
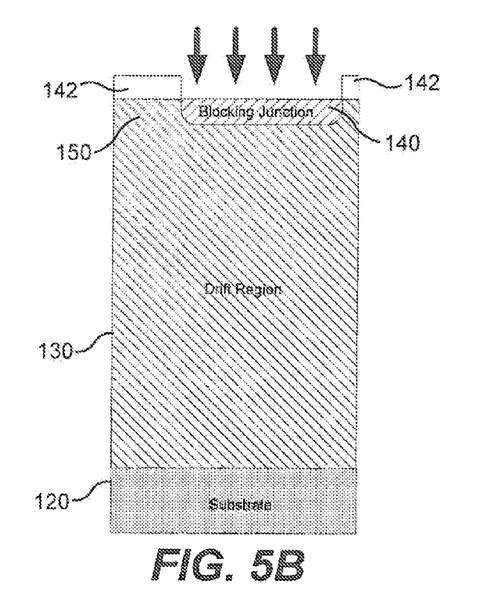

As shown in FIG. 5A, an n-type drift region 130 is epitaxially grown on a silicon carbide substrate 120. In some embodiments, the drift region 130 may be doped during growth with n-type impurities to a concentration of, for example, between $1 \times 10^{15}/cm^3$ and $5 \times 10^{16}/cm^3$. In this example, it is assumed that the drift region 130 is doped with n-type impurities during growth to a concentration of $1 \times 10^{16}/cm^3$. Referring to FIG. 5B, next, an ion implantation mask layer (not shown) may be formed on the drift region 130, and this mask layer may then be patterned via, for example, conventional photolithography processing steps to form an ion implantation mask pattern 142. Subsequently, p-type dopants may be implanted into the upper portions of the n-type drift region 130 that are exposed by the ion implantation mask pattern 142 in order to form the p-type blocking junctions 140. The p-type blocking junctions 140 may be highly doped with p-type dopants (e.g., to a concentration of $5 \times 10^{18}/cm^3$).

Figure 5C:
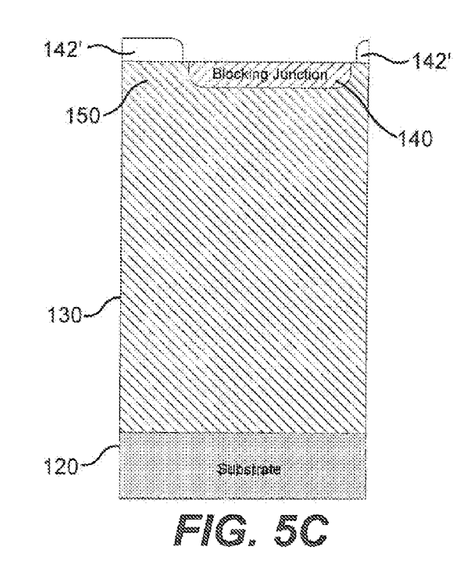

Referring to FIG. 5C, an etching process may be performed to etch the ion implantation mask pattern 142 to provide an etched ion implantation mask 142'. In example embodiments, the ion implantation mask pattern 142 may be an oxide mask pattern (e.g., a silicon oxide pattern). A buffered oxide etch or other appropriate etching process may then be performed under tightly controlled conditions in order to remove a predetermined amount of material from the upper surface and exposed sidewalls of the ion implantation mask pattern 142. Such an etching process may have a high degree of accuracy so that the amount of material removed from the sidewalls of the mask pattern 142 may be precisely controlled. In example embodiments, the amount of material removed from the sidewalls of the ion implantation mask pattern 142 in forming the etched ion implantation mask 142' may be between 0.2 and 0.5 microns of material, although different amounts may be removed in other embodiments.

Figure 5D:
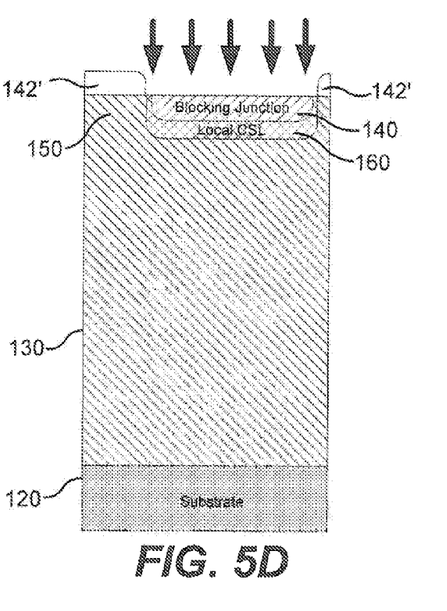

Referring to FIG. 5D, a second ion implantation may be performed to implant n-type dopants into the regions of the device exposed by the etched ion implantation mask 142' to form the local current spreading layers 160. The n-type dopants may be implanted at a concentration of, for example, $1 \times 10^{17}/cm^3$. The n-type dopants may be implanted into the p-type blocking junction 140 and into the portions of the upper part of the drift region that are adjacent the p-type blocking junctions 140 that are exposed by the etched mask pattern 142'. As the p-type blocking junction 140 may be doped at a much higher doping concentration, the implantation of the moderate n-type doping used to form the local current spreading layers 160 does not material impact the doping of the p-type blocking junctions 140. The second ion implantation step that is used to form the local current spreading layers 160 may be designed to implant the n-type dopants deeper into the device than the first ion implantation step that is used to form the p-type blocking junctions 140. Consequently, the local current spreading layers 160 may extend beneath their respective p-type blocking junctions 140 to form a shield against the electric field in the drift region 130 during reverse blocking operation.

It will also be appreciated that in other embodiments the p-type blocking junctions 140 and the n-type local current spreading layers 160 may be formed in the reverse order. For example, the ion implantation mask 142 shown in FIG. 5B may be formed to have wider openings (namely openings having the width shown in FIG. 5C), and n-type dopants may be implanted through these openings to form the local current spreading layers 160. Then, an oxide layer may be conformally grown or deposited on the ion implantation mask to create a revised ion implantation mask having openings with the width illustrated in FIG. 5B. The p-type dopants may then be implanted through these openings to form the p-type blocking junctions 140. Thus, it will be appreciated that the methods discussed herein describe example methods for forming the power Schottky diodes according to embodiments of the present invention, and that other methods of forming these devices may be used.

Figure 5E:
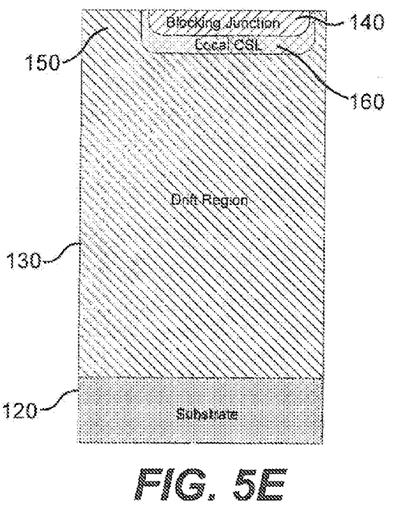
Figure 5F:
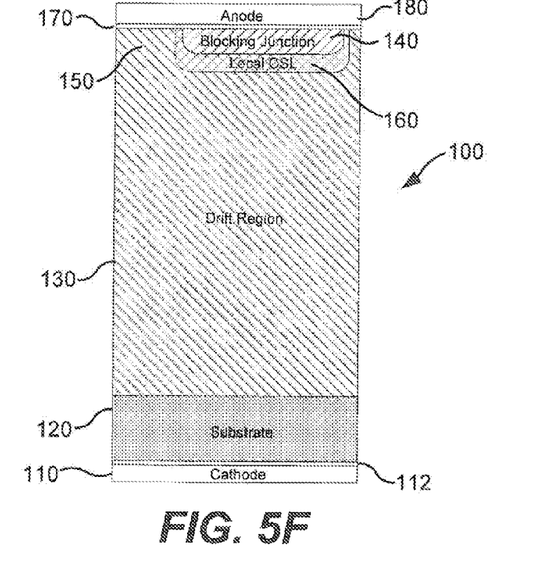

As shown in FIG. 5E, the etched ion implantation mask pattern 142' may then be removed. Finally, as shown in FIG. 5F, the ohmic contact layer 112, the cathode contact 110, the Schottky contact 170 and the anode contact 180 may be formed to complete the power Schottky diode 100.

Figure 6:
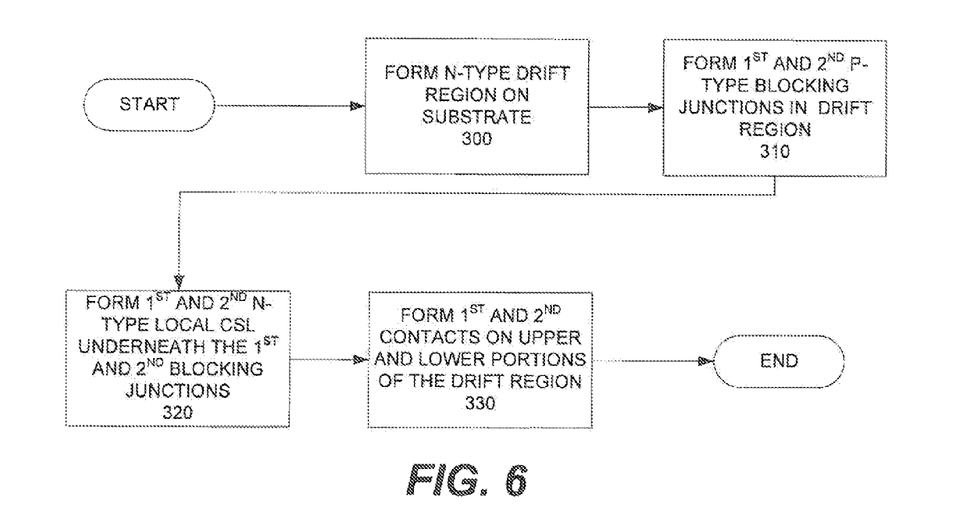
FIG. 6 is a flowchart that illustrates a method of fabricating a power Schottky diode having local current spreading layers according to embodiments of the present invention.

FIG. 6 is a flowchart that illustrates a method of fabricating a power Schottky diode according to embodiments of the present invention. As shown in FIGS. 5A and 6, an n-type drift layer may be formed on an n-type substrate (Block 300). As shown in FIGS. 5B and 6, first and second p-type blocking junctions may then be formed in respective locations in the upper portion of the drift region (Block 310). In some embodiments, the first and second p-type blocking junctions may be formed in the upper portion of the drift region by forming an ion implantation mask pattern on an upper surface of the drift region and then implanting p-type dopants into the upper portion of the drift region through openings in the ion implantation mask pattern. As shown in FIGS. 5C, 5D and 6, first and second n-type local current spreading layers may then be formed underneath the respective first and second blocking junctions (Block 320).

As shown in FIGS. 5C and 5D, in some embodiments, the first and second n-type local current spreading layers may be formed underneath the respective first and second blocking junctions by partially etching the ion implantation mask pattern to provide an etched ion implantation mask pattern and then implanting n-type dopants into the upper portion of the drift region through openings in the ion implantation mask pattern to form the first and second local current spreading layers. The n-type dopants may be implanted deeper into the drift region than the p-type dopants that are implanted to form the first and second blocking junctions. In some embodiments, a channeled ion implantation process may be used to implant the n-type dopants that are implanted to form the first and second local current spreading layers. In one example embodiment, the drift region may be 4H silicon carbide, and the channeled ion implantation may comprise implanting the n-type dopants at an angle that is within +/−1.5° of one of the <11-23>, <-1-123>, <1-213>, <-12-13>, <2-1-13> or <-2113> crystallographic axes of the drift region.

As shown in FIG. 5D, in some embodiments, the first local current spreading layer may surround a bottom and sidewalls of the first blocking junction. In such embodiments, a portion of the first local current spreading layer may be within the channel. A lateral width of the portion of the first local current spreading layer that is within the channel may be between about 0.1 and about 0.75 microns in example embodiments. In other example embodiments, the lateral width of the portion of the first local current spreading layer that is within the channel may be between about 0.3 and about 0.6 microns. In still other embodiments, the lateral width of the portion of the first local current spreading layer that is within the channel may be between about 0.4 and about 0.5 microns.

As shown in FIGS. 5F and 6, first and second contacts may then be formed on the respective upper and lower portions of the drift region (Block 330). The first and second blocking junctions define a channel in the upper portion of the drift region, the channel doped with dopants having the first conductivity type and a concentration of dopants in at least a first portion of the channel being lower than the concentration of dopants in the first and second local current spreading layers.

While FIG. 6 describes formation of a power Schottky diode having an n-type drift layer, it will be appreciated that the conductivity type of each layer/region could be reversed in other embodiments.

Figure 7A:
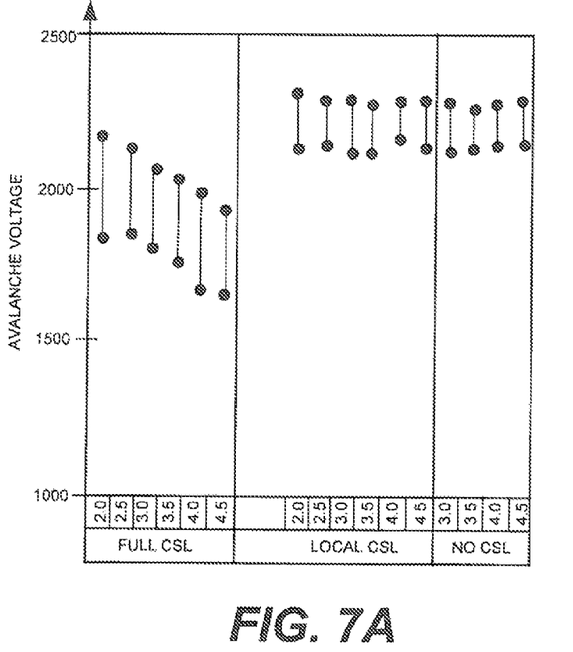
FIGS. 7A-7C are graphs that illustrate the performance of power Schottky diodes according to embodiments of the present invention.
Figure 7B:
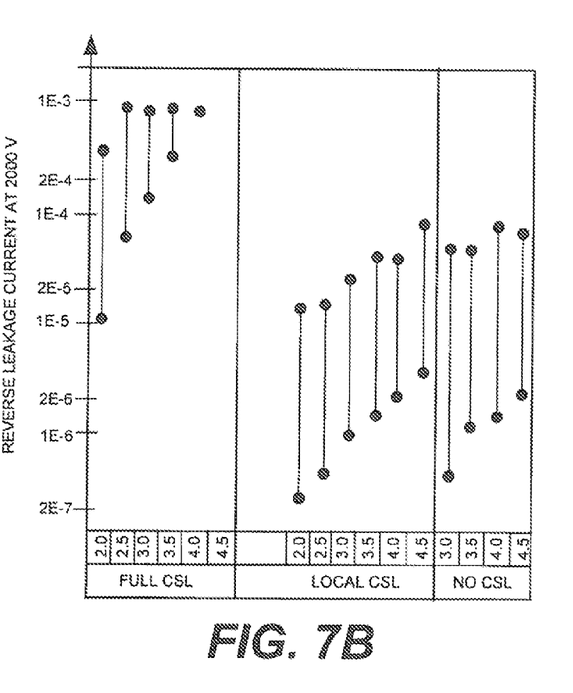
Figure 7C:
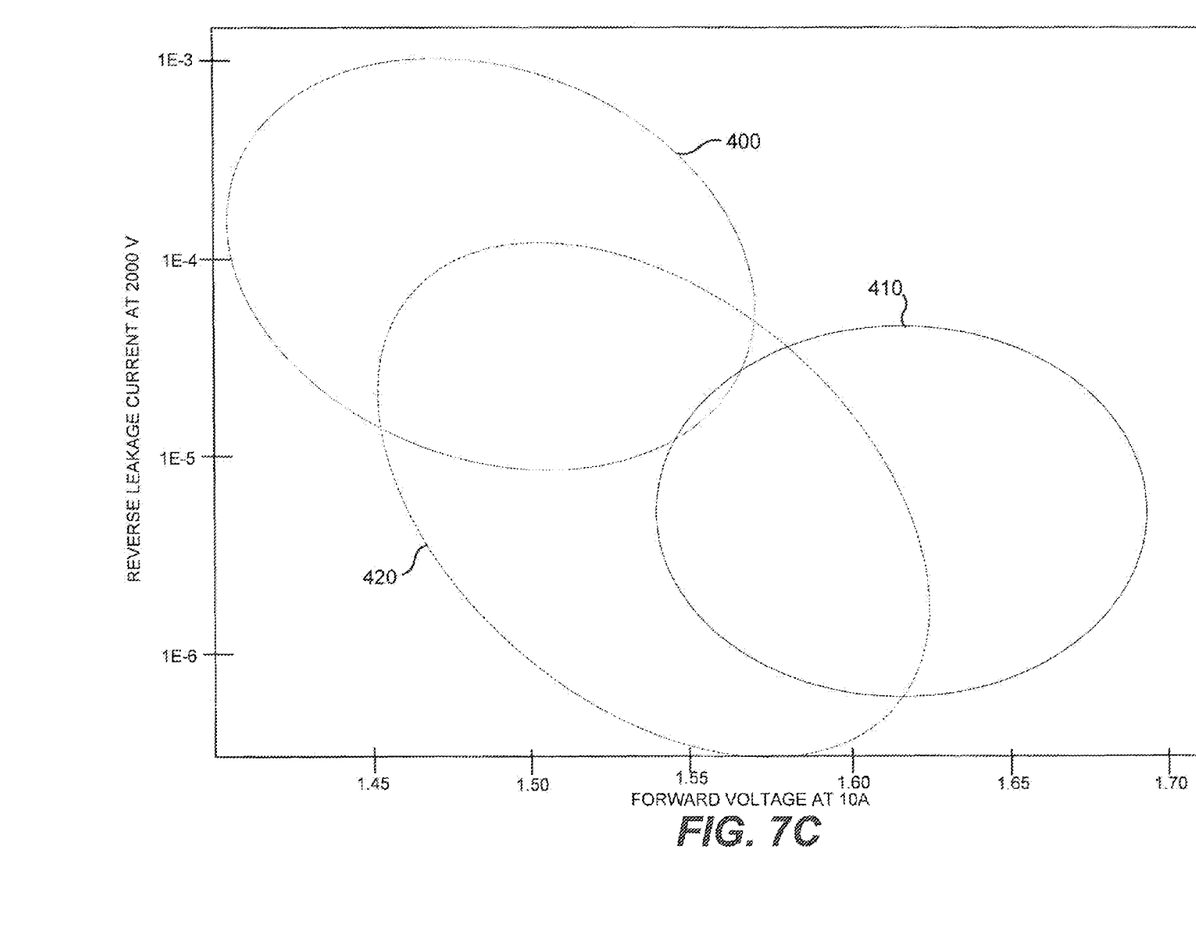

FIGS. 7A-7C are graphs that illustrate the performance of the power Schottky diodes according to embodiments of the present invention of FIGS. 3A-3B as compared to (1) power Schottky diodes having full current spreading layers ("full CSL") in the upper portion of the drift region and (2) optimized power Schottky diodes that do not include any current spreading layer ("no CSL"). The power Schottky diodes having full current spreading layers comprise devices in which the upper portion of the drift region is grown with a higher doping concentration to form a continuous current spreading layer. The p-type blocking junctions are then formed in the continuous current spreading layer.

FIG. 7A illustrates the avalanche voltage of power Schottky diodes having local current spreading layers according to embodiments of the present invention as compared to full CSL and no CSL power Schottky diodes. In FIG. 7A, each vertical column of data points represents individual results for sample devices taken from different wafers. Thus, the length of each vertical column provides an indication as to the amount of process variation, with longer lengths indicating greater amounts of variation. Results are provided for both the full CSL and the local CSL power Schottky diodes having channel widths W2 of 2.0, 2.5, 3.0, 3.5, 4.0 and 4.5 microns, and for the no CSL power Schottky diodes having channel widths W2 of 3.0, 3.5, 4.0 and 4.5 microns.

As shown in FIG. 7A, the local CSL power Schottky diodes exhibit improved avalanche breakdown performance (which is used as an indication of reverse blocking voltage) as compared to the full CSL power Schottky diodes at all channel widths investigated, and provide comparable avalanche breakdown performance to the no CSL power Schottky diodes. The local CSL and no CSL power Schottky diodes exhibit avalanche breakdown voltages from about 2150-2300 volts, while the full CSL power Schottky diodes exhibit avalanche breakdown voltages of 1700-2100 volts. The local CSL power Schottky diodes exhibit performance variation that is less than half the variation seen in the full CSL power Schottky diodes, and process variation that is comparable to the no CSL power Schottky diodes. Moreover, the local CSL power Schottky diodes (and the no CSL power Schottky diodes) maintain consistent performance regardless of the channel width, while the performance of the full CSL devices decreases with increasing channel width. Moreover, while not shown in FIG. 7A, the local CSL power Schottky diodes exhibit significantly less variation as a function of doping of the current spreading layer as compared to the full CSL power Schottky diodes, which exhibit decreasing performance with increasing doping concentrations.

FIG. 7B illustrates the reverse leakage current performance of the local CSL power Schottky diodes according to embodiments of the present invention as compared to no CSL and full CSL power Schottky diodes. As shown in FIG. 7I, the local CSL power Schottky diodes exhibit dramatically improved reverse leakage current performance at all channel widths as compared to the full CSL power Schottky diodes, and also exhibit improved performance as compared to the no CSL power Schottky diodes. The process variation for the local CSL devices is slightly higher than the full CSL power Schottky diodes and comparable to the no CSL power Schottky diodes. However, since the average reverse leakage current for the local CSL power Schottky diodes is 1-2 orders of magnitude lower than the average reverse leakage current for the full CSL power Schottky diodes, the increased process variation is not problematic. The reverse leakage current performance of the local CSL power Schottky diodes is dependent on the channel width, with smaller channel widths providing improved performance.

FIG. 7C is a simplified scatter plot illustrating the reverse leakage current and forward voltage performance of sample local CSL, full CSL and no CSL power Schottky diodes. In particular, instead of illustrating individual data points as in a conventional scatter plot, FIG. 7C shows three regions 400, 410, 420. Region 400 is the approximate boundary showing the $V_F$-$I_R$ performance for a large number of samples of full CSL power Schottky diodes. As shown in FIG. 7C, these devices exhibited relatively low forward voltage values, but relatively high reverse leakage currents. Region 410 is the approximate boundary showing the $V_F$-$I_R$ performance for a large number of samples of no CSL power Schottky diodes. As shown in FIG. 7C, these devices exhibited relatively high forward voltage values, and relatively low reverse leakage currents, or essentially the opposite performance of the full CSL devices. Region 420 is the approximate boundary showing the $V_F$-$I_R$ performance for a large number of samples of local CSL power Schottky diodes according to embodiments of the present invention. As shown in FIG. 7C, these devices exhibited relatively low forward voltage values and relatively low reverse leakage currents. Thus, FIG. 7C clearly illustrates that the local CSL power Schottky diodes according to embodiments of the present invention provide the best combination of performance in terms of low reverse leakage current and low forward voltage values.

The power Schottky diodes according to embodiments of the present invention may have relatively wide channel widths such as channel widths of 2.0 microns or more. Devices having such channel widths may be readily formed using conventional manufacturing techniques. The local current spreading layers meanwhile may allow for lower reverse leakage currents and higher reverse blocking voltage while still meeting a desired forward voltage level. Moreover, the larger channel width may result in reduced process variation and may significantly improve device yields.

The power Schottky diodes according to embodiments of the present invention may exhibit a number of advantages as compared to conventional power devices. For example, as noted above, the power Schottky diodes according to embodiments of the present invention may exhibit lower electric field levels in the channels when the diodes are in their reverse blocking state. As a result, the depletion regions of the unit cells may tend to merge at a deeper depth within the device layer structure (i.e., toward the substrate) as compared to conventional devices. As a result, the power Schottky diodes according to embodiments of the present invention may exhibit reduced reverse leakage current. The merging of these depletion regions may also provide enhanced voltage blocking capabilities as compared to conventional devices.

Additionally, the Schottky diodes according to embodiments of the present invention may also provide a non-destructive avalanche current path within an active area of the device. As known to those of skill in the art, "avalanche breakdown" refers to a rapid current multiplication that can occur when a strong electric field is applied to the device. In power silicon carbide devices, much of this avalanche current will typically flow through a termination region of the device that surrounds the active area. Unfortunately, the termination regions of such devices typically cannot handle avalanche current levels, and thus if avalanche breakdown occurs, the device may be permanently destroyed. The local current spreading layers included in the power Schottky diodes according to embodiments of the present invention may make it easier for avalanche currents to flow through the active area of the device, as the increased doping level under the blocking junctions results in an increased electric field at the p-n junction formed at the underside of the blocking junctions, which facilitates avalanche conditions being reached. As a result, Schottky diodes according to embodiments of the present invention may include leakage current paths within the active area of the device that carry the avalanche current when the device breaks down. When the avalanche current is carried through these leakage current paths it may not destroy the device, and hence the Schottky diodes according to certain embodiments of the present invention may be more likely to survive avalanche events.

While the above embodiments of the present invention have primarily been discussed with reference to silicon carbide devices, it will be appreciated that the above techniques may also be used on other types of power Schottky diodes including power Schottky diodes fabricated in gallium nitride based materials.

While in the description above, the example embodiments are described with respect to semiconductor devices that have n-type substrates and channels in n-type portions of the drift layers, it will be appreciated that opposite conductivity type devices may be formed by simply reversing the conductivity of the n-type and p-type layers in each of the above embodiments. Thus, it will be appreciated that the present invention covers both n-type and p-type devices. Accordingly, the claims appended hereto refer to the first and second conductivity type dopants as opposed to n-type and p-type dopants. It will likewise be appreciated that typically each power semiconductor device formed according to the ion implantation techniques disclosed herein will comprise a plurality of individual devices that are disposed in parallel in a unit cell structure.

Herein, embodiments of the present invention are typically described with respect to cross-sectional diagrams that only illustrate one or two unit cells of a power Schottky diode. It will be appreciated that actual implementations will typically include a larger number of unit cells. However, it will also be appreciated that the present invention is not limited to such devices, and that the claims appended hereto also cover power Schottky diodes that comprise a single unit cell.

The local current spreading layers according to embodiments of the present invention may be implemented in vertical power Schottky diodes that have a drift region that extends vertically between cathode and anode contacts. In such devices, the lateral direction refers to the horizontal direction. Thus, the lateral width of a channel refers to the horizontal width of the channel and may be measured as the distance between sidewalls of adjacent blocking junctions.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, operations, elements, and/or components, but do not preclude the presence or addition of one or more other features, operations, elements, components, and/or groups thereof.

Relative terms such as "below" or "above" or "upper" or "lower" and the like may be used herein to describe a relationship of one element, layer or region to another element, layer or region as illustrated in the figures. It will be understood that these terms are intended to encompass different orientations of the device in addition to the orientation depicted in the figures.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments of the present invention are described above with reference to a flowchart. It will be understood that the operations specified in certain blocks of the flowchart may be carried out at the same time and/or in an order different than shown in different embodiments.

Embodiments of the invention are described herein with reference to plan and cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:
1. A Schottky diode, comprising:
a drift region having an upper portion and a lower portion, at least some of the drift region doped with dopants having a first conductivity type;
a first blocking junction and a second blocking junction in the upper portion of the drift region, the first and second blocking junctions doped with dopants having a second conductivity type, the second conductivity type being opposite the first conductivity type;
a first local current spreading layer underneath the first blocking junction and a second local current spreading layer underneath the second blocking junction, the first and second local current spreading layers doped with dopants having the first conductivity type;

a first contact on the upper portion of the drift region;

a second contact on the lower portion of the drift region and vertically spaced apart from the first contact; and a channel in the upper portion of the drift region between the first and second blocking junctions, the channel doped with dopants having the first conductivity type and a concentration of dopants in at least a first portion of the channel being lower than the concentration of dopants in the first and second local current spreading layers.

2. The Schottky diode of claim 1, wherein the first local current spreading layer includes a lateral section that extends underneath the first blocking junction and a vertical section that extends upwardly from the lateral section along a sidewall of the first blocking junction, the vertical section comprising part of the channel.

3. The Schottky diode of claim 2, wherein a width of the vertical section of the first local current spreading layer is between 0.1 and 0.75 microns.

4. The Schottky diode of claim 1, wherein a distance between the first and second blocking junctions is between 1.5 microns and 5.0 microns.

5. The Schottky diode of claim 1, wherein a doping concentration of at least a portion of the local current spreading layer exceeds a doping concentration of the first portion of the channel by at least a factor of five.

6. The Schottky diode of claim 1, wherein a lateral width of the first blocking junction is approximately equal to a lateral width of the first current spreading layer.

7. The Schottky diode of claim 1, wherein the drift region includes a superjunction structure having alternating vertically extending regions of silicon carbide having the respective first and second conductivity types.

8. The Schottky diode of claim 1, wherein the drift region, the first and second blocking junctions and the first and second local current spreading layers comprise silicon carbide, and wherein a substrate is interposed between the lower portion of the drift region and the second contact.

9. A Schottky diode, comprising:

a drift region having an upper portion and a lower portion, at least some of the drift region doped with dopants having a first conductivity type;

a first blocking junction and a second blocking junction in the upper portion of the drift region, the first and second blocking junctions doped with dopants having a second conductivity type, the second conductivity type being opposite the first conductivity type;

a first contact on the upper portion of the drift region;

a second contact and separated from the first contact along a vertical axis; and a channel doped with dopants having the first conductivity type in the upper portion of the drift region between the first and second blocking junctions, the channel having a non-uniform doping concentration along a lateral cross-section thereof.

10. The Schottky diode of claim 9, further comprising a first local current spreading layer underneath the first blocking junction and a second local current spreading layer underneath the second blocking junction, the first and second local current spreading layers doped with dopants having the first conductivity type, the concentration of dopants in the first and second local current spreading layers being higher than the concentration of dopants in the drift region.

11. The Schottky diode of claim 10, wherein a vertical section of the first local current spreading layer comprises a first side portion of the channel and a vertical section of second local current spreading layer comprises a second side portion of the channel that is opposite the first side of the channel, the vertical sections of the first and second local current spreading layers having a higher doping concentration than a middle section of the channel so that the channel has the non-uniform doping concentration along the lateral cross-section thereof.

12. The Schottky diode of claim 11, wherein a width of the vertical section of the first local current spreading layer is between 0.1 and 0.75 microns.

13. The Schottky diode of claim 9, wherein a distance between the first and second blocking junctions is at least 1.5 microns.

14. The Schottky diode of claim 10, wherein a doping concentration of at least a portion of the local current spreading layer exceeds a doping concentration of a middle section of the channel by at least a factor of five.

15. The Schottky diode of claim 10, wherein a lateral width of the first blocking junction is less than a lateral width of the first local current spreading layer.

16. The Schottky diode of claim 10, wherein the drift region includes a superjunction structure having alternating vertically extending regions of silicon carbide having the respective first and second conductivity types.

17. The Schottky diode of claim 10, wherein the drift region, the first and second blocking junctions and the first and second local current spreading layers comprise silicon carbide.

18. The Schottky diode of claim 1, wherein first and second doping concentrations of the respective first and second local current spreading layers exceed a third doping concentration of the lower portion of the drift region and a fourth doping concentration of an upper portion of the drift region that is below the first and second local current spreading layers.

19. The Schottky diode of claim 9, further comprising a substrate on the lower portion of the drift region, wherein the second contact is on the substrate opposite the drift region.

* * * * *